(12) United States Patent
Cheng et al.

(10) Patent No.: US 6,423,577 B1
(45) Date of Patent: Jul. 23, 2002

(54) METHOD FOR REDUCING AN ELECTRICAL NOISE INSIDE A BALL GRID ARRAY PACKAGE

(75) Inventors: Cheng-Chung Cheng; Chen-Wen Tsai; Chia-Wen Shih, all of Hsinchu (TW)

(73) Assignee: Silicon Integrated Systems Corp., Hsinchu (TW)

( * ) Notice: Subject to any disclaimer, the term of this patent is extended or adjusted under 35 U.S.C. 154(b) by 0 days.

(21) Appl. No.: 09/562,557

(22) Filed: May 2, 2000

(51) Int. Cl.[7] .............................................. H01L 21/44
(52) U.S. Cl. ...................... 438/118; 438/107; 438/110
(58) Field of Search ................................. 438/107, 110, 438/118, 119; 257/723, 724

(56) References Cited

U.S. PATENT DOCUMENTS

| | | | | |
|---|---|---|---|---|
| 5,605,477 A | * | 2/1997 | Wu et al. .................... | 439/620 |
| 5,866,942 A | * | 2/1999 | Suzuki et al. ................ | 257/678 |
| 5,949,654 A | * | 9/1999 | Fukuoka ...................... | 257/700 |
| 6,132,543 A | * | 10/2000 | Mohri et al. ................. | 156/230 |
| 6,198,136 B1 | * | 3/2001 | Voldman et al. ............. | 257/357 |
| 6,222,260 B1 | * | 4/2001 | Liang et al. ................. | 257/666 |
| 6,261,467 B1 | * | 7/2001 | Giri et al. ..................... | 216/13 |

* cited by examiner

Primary Examiner—Kevin M. Picardat
(74) Attorney, Agent, or Firm—Ladas & Parry

(57) ABSTRACT

A method for reducing electrical noise inside a ball grid array package for installing capacitors between a plurality of power pads and ground pads on a top side of a substrate of the ball grid array package coats solder paste on the plurality of power pads and ground pads, coats adhesive glue beneath the plurality of capacitors, fixes the plurality of capacitors on the power pads and ground pads with the adhesive glue and solder paste, and solidifies the adhesive glue in a reflow soldering stove.

11 Claims, 6 Drawing Sheets

METHOD FOR REDUCING AN ELECTRICAL NOISE INSIDE A BALL GRID ARRAY PACKAGE

BACKGROUND OF THE INVENTION

1. Field of the Invention

The present invention relates to a method for reducing an electrical noise inside a ball grid array package, and particularly to a method for embedding a plurality of capacitors between power pads and ground pads on a ball grid array package by a semiconductor package technology.

2. Description of Related Art

For the progress of semiconductor process technology, hundreds of thousands or even millions of transistors are built inside an integrated circuit chip, and therefore hundreds of I/O ports would be seen. If the hundreds of I/O ports are switching simultaneously, a bounce voltage on power supply and reference ground will be induced, so that computing results of the integrated circuit are unstable.

For resolving the problem of the unstable voltage and electrical noise, a prior method fixes a plurality of capacitors on a circuit board where the integrated circuit is located, to eliminate the electrical noise. FIG. 1 is a top view of a prior plastic ball grid array (PBGA) package. The plastic ball grid array package 11 is fixed on a circuit board 13, and a plurality of outside-connected capacitors 12 are provided around the PBGA package 11. Each of the outside-connected capacitors is electrically connected to the power plane and ground plane (not shown) of the PBGA package 11 to eliminate an electrical noise induced on the power plane and ground plane.

The prior method requires a lot of capacitors of different sizes and different kinds on the circuit board 13, and not only costs much but also occupies a large area on the circuit board. Moreover, the prior method is not suitable for use in the modern tendency to compactness.

SUMMARY OF THE INVENTION

Accordingly, an object of the present invention is to resolve the drawbacks of high cost and large area occupied as in the prior art. In order to accomplish the object, the present invention proposes a manufacturing method for reducing an electrical noise inside a ball grid array package. The manufacturing method fixes a plurality of inside-connected capacitors between power pads and ground pads of a substrate by semiconductor packaging technology. The plurality of inside-connected capacitors are directly, or through vias embedded conductive materials, electrically connected to a power plane and ground plane of the substrate to efficiently achieve the purposes of providing a stable voltage and filtering the electrical noise.

The manufacturing method of the present invention for reducing the electrical noise inside a ball grid array package can install the capacitors on is the top side of the substrate, or on the bottom side of the substrate or on both sides of the substrate. The most outstanding advantage of the present invention is to adhere the capacitors on the substrate in one time through a reflow soldering stove, therefore reducing the cycle time of process and raising throughput of the ball grid array package.

When the capacitors are installed on the top side of the substrate, the method of the present invention comprises the following steps: coating solder paste on a plurality of power pads and ground pads; coating adhesive glue beneath a plurality of capacitors; fixing the plurality of capacitors on the power pads and ground pads by said adhesive glue and solder paste; and solidifying the adhesive glue by passing the substrate through a reflow soldering stove.

When the capacitors are installed on the bottom side of the substrate, the method of the present invention comprises the following steps: coating solder paste on a plurality of power pads and ground pads; coating adhesive glue beneath the plurality of capacitors; fixing the plurality of capacitors on the power pads and ground pads by said adhesive glue and solder paste; placing a plurality of soldering balls; and solidifying the adhesive glue by passing the substrate through a reflow soldering stove.

When the capacitors are installed on both sides of the substrate, the present invention comprises the following steps: coating solder paste on a plurality of power pads and ground pads on said top and bottom sides of said substrate; coating adhesive glue beneath a plurality of capacitors; fixing the plurality of capacitors on the power pads and ground pads on said top and bottom sides of said substrate by said adhesive glue and solder paste; placing a plurality of soldering balls on the bottom side of the substrate; and solidifying the adhesive glue by passing the abstrate through a reflow soldering stove.

BRIEF DESCRIPTION OF THE DRAWINGS

The present invention will be described according to the appended drawings in which.

PREFERRED EMBODIMENT OF THE PRESENT INVENTION

Figure 1:
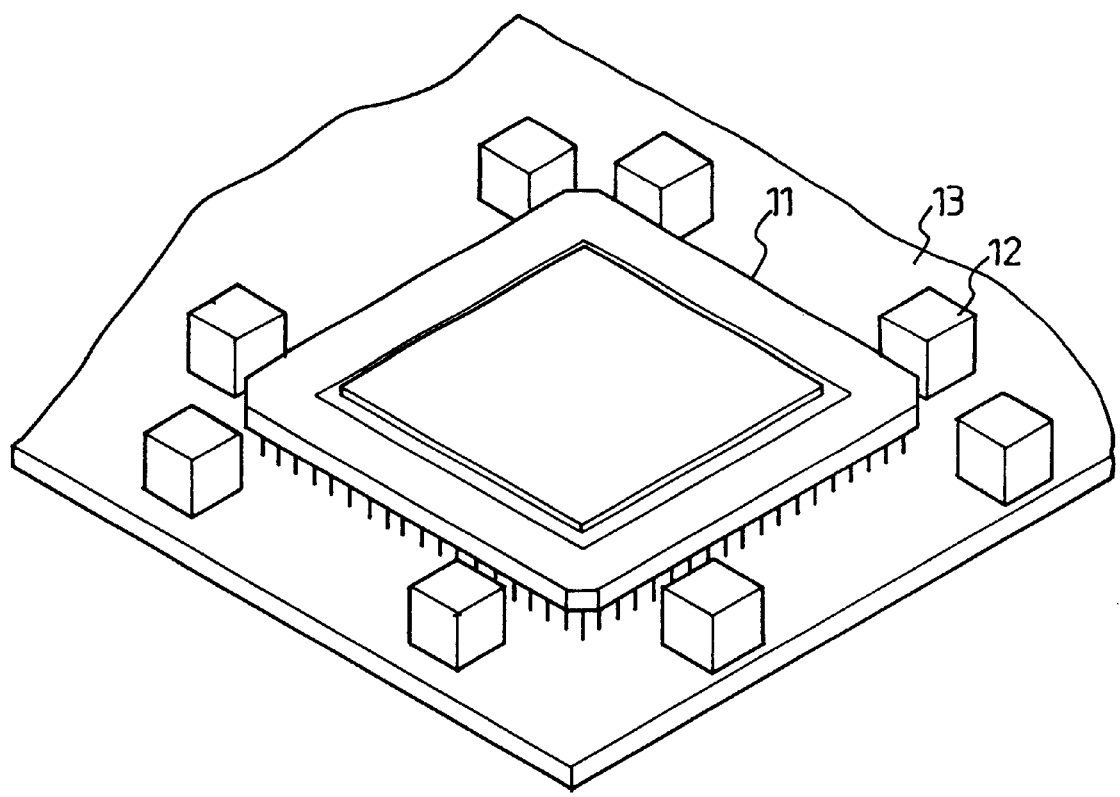
FIG. 1 is a top view of a prior ball grid array package.
Figure 2:
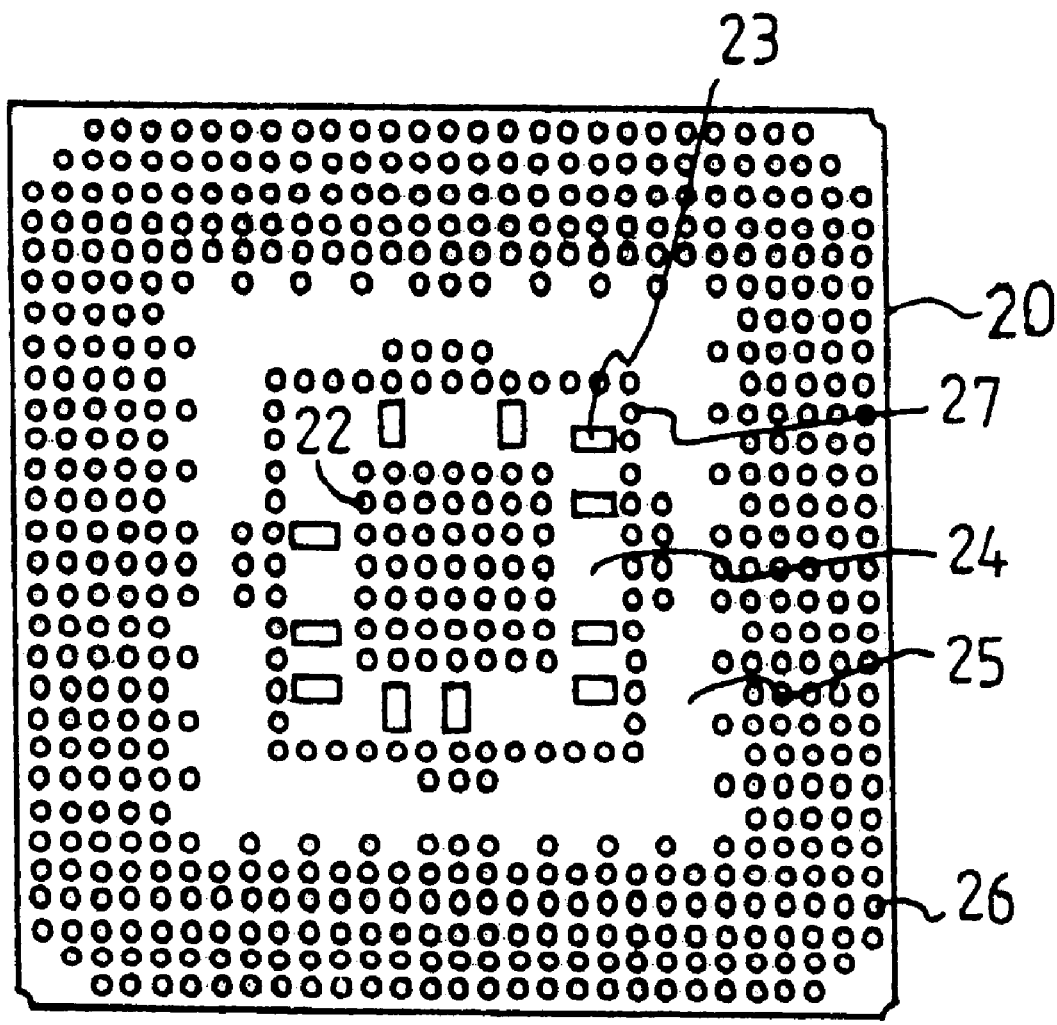
FIG. 2 is a schematic diagram of the bottom side of the substrate according to the present invention.

FIG. 2 is a schematic diagram of the bottom side of a substrate according to the present invention. A ground plane 24 is situated on the central part of the substrate 20, and a plurality of ground balls 22 are situated on the ground plane 24. A power plane 25 is around the ground plane 24, and a plurality of power balls 27 are situated on the power plane 25. A plurality of capacitors 23 are fixed on the substrate 20 and electrically connected to the ground plane 24 and power plane 25. The function of the capacitors 23 is similar to the function of the outside-connected capacitors 12 shown in FIG. 1. The capacitors can provide stable voltage and filter an electrical noise on the power plane 25 and ground plane 24. A plurality of signal balls 26 are situated outside the power plane 25. In this application, the ground ball 22, power ball 27 and signal ball 26 are all called "solder balls." The plurality of ground balls 22, power balls 27 and signal balls 26 can transmit or receive electrical signals from a circuit board 13 where the integrated circuit are located, and further release thermal energy inside the substrate 20 to the circuit board 13. The capacitors 23 are not limited to any material. Materials which satisfy the packaging technology of integrated circuit can be used.

Figure 3:
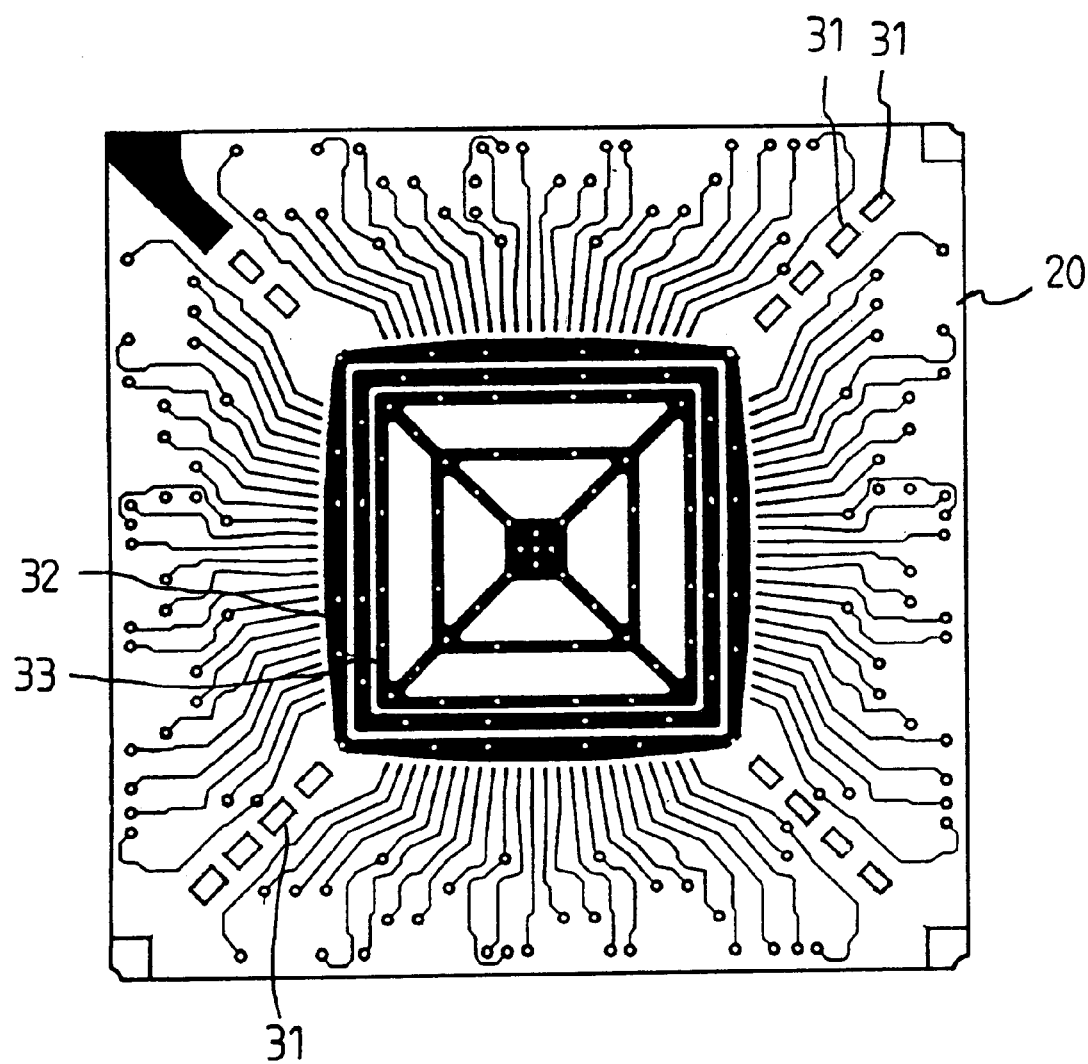
FIG. 3 is a schematic diagram of the top side of the substrate according to the present invention.

FIG. 3 is a schematic diagram of the top side of the substrate according to the present invention. A die area 33 is on the central part of the substrate 20 and a wire-bonding area 32 is around the die area 33. I/O pads of a die on the die area 33 are electrically connected to the corresponding wire-bonding points on the wire-bonding area 32 by the step of wire bonding. Pairs of ground pads and power pads (not shown) are placed on the four diagonals of the substrate 20, and the ground pads and power pads are electrically connected to the ground plane 24 and power plane 25. The positions of the power pads and ground pads are shown as an example but not to limit the application of the invention. A plurality of capacitors 31 are placed on the pairs of ground pads and power pads to stabilize the voltage and filter the electrical noise between the power plane 25 and ground plane 24.

Figure 4A:
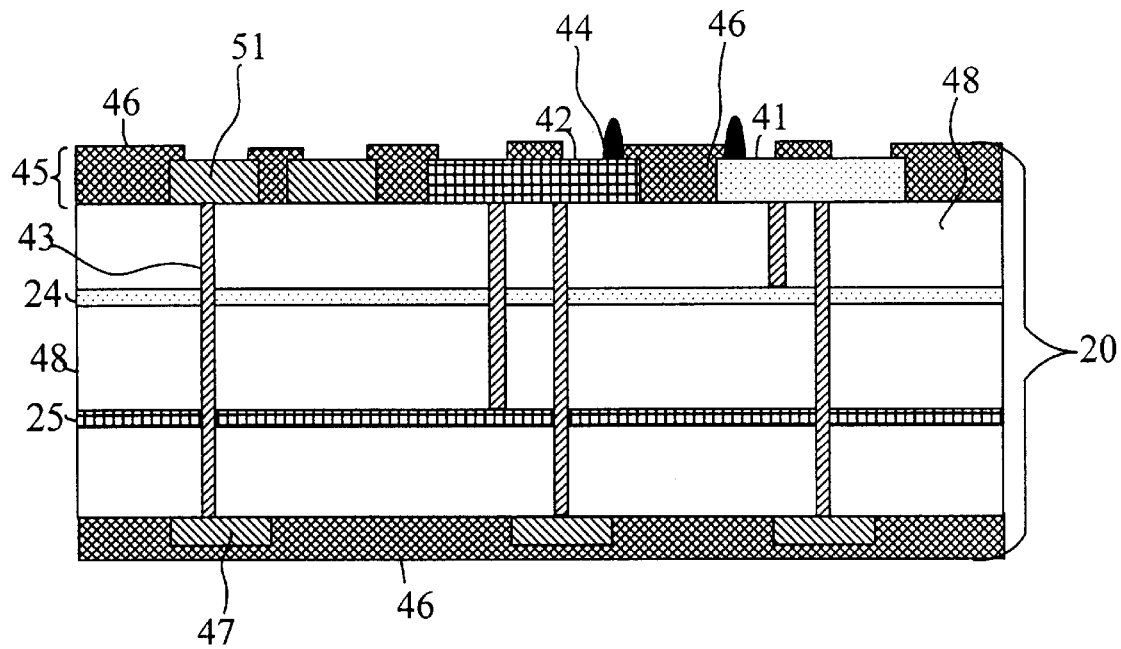
FIGS. 4(a) to 4(c) are cross-sectional views of structures made by a manufacturing method according to a first preferred embodiment of the present invention.
Figure 4B:
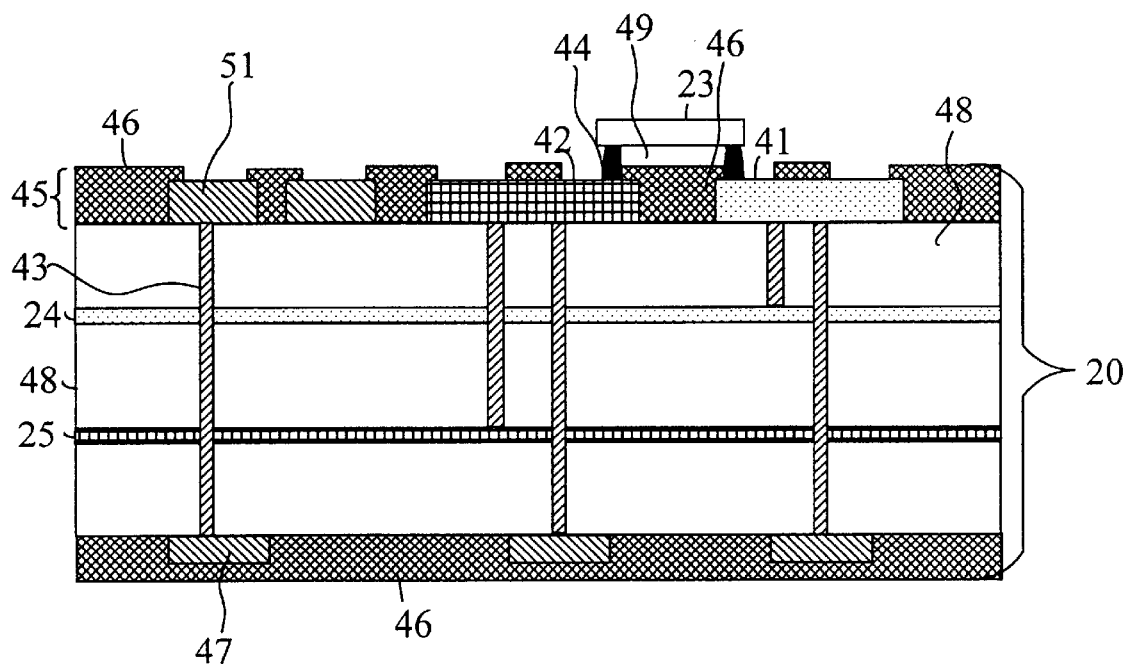
Figure 4C:
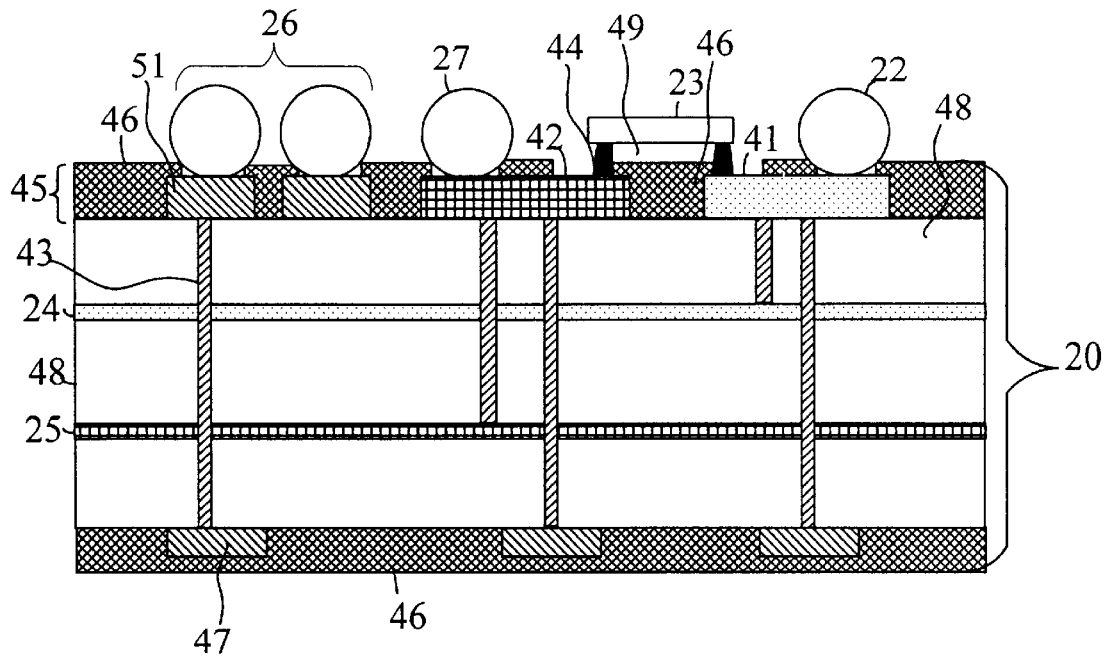

FIGS. 4(a) to 4(c) are cross-sectional views of structures made by the manufacturing method according to a first preferred embodiment of the present invention. This embodiment is to place the capacitors 23 on the bottom side of a four-layer substrate, but can also be applied in the substrate of other number of layers. If the substrate 20 uses a two-layer substrate, then the ground plane 24 and power plane 25 will be limited to a specific region and the capacitors 23 will be limited to this specific region, too. Relatively, the different planes inside a multi-layer structure can be electrically connected to each other through a plurality of vias 43 to avoid the limitation of a two-layer structure. The present invention can use the flexible characteristic of a multi-layer structure to fix the capacitors 23 on a spare region of the substrate 20 to raise the utilization of the substrate 20. Referring to FIGS. 4(a)–4(c), a contact layer 45, a power plane 25 and a ground plane 24 are situated on different layers of the substrate 20, and all the layers are separated by insulating layers 48. The insulating layer 48 is not limited to any material, and BT resins seen as usual can be applied. The power plane 25 and ground plane 24 can be electrically connected to relative positions as power pads 42 and ground pads 41 through vias 43 embedded with conductive materials, to reduce the electrical noise on the power plane 25 and ground plane 24. A solder mask 46 can be used to isolate between the power pads 42 and the ground pads 41. In FIG. 4(a), a solder paste 44 is coated on the plurality of power pads 42 and ground pads 41 after the step of molding a compound on the substrate 20. The solder paste 44 is not limited to any material, and an alloy made from tin and lead can be used, such as an alloy made from 63% tin and 37% lead. In FIG. 4(b), an adhesive glue 49 is coated beneath the plurality of capacitors 23, and the plurality of capacitors 23 are fixed on the power pads and ground pads by the adhesive glue 49 and solder paste 44. The solder paste 44 is not limited to any material, and red glue seen as usual can be applied. In FIG. 4(c), a plurality of soldering balls 22, 26 and 27 are placed on an opposite position 51 of the contact layer 45 corresponding to a signal plane 47, and is pasted through a reflow soldering stove (not shown) to complete all adhering steps. After that, the adhesive glue 49 is solidified. Then, impurities on the bottom side of the substrate 20 are removed. For example, the impurities are cleaned by a DI water.

Figure 5A:
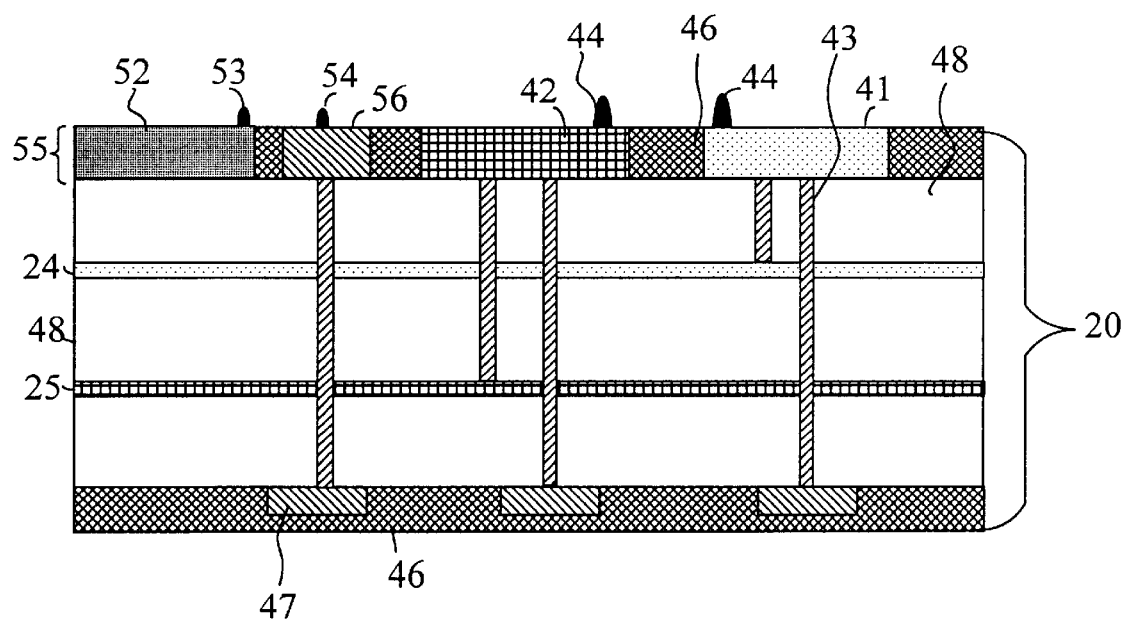
FIGS. 5(a) to 5(c) are cross-sectional views of structures made by a manufacturing method according to a second preferred embodiment of the present invention.
Figure 5B:
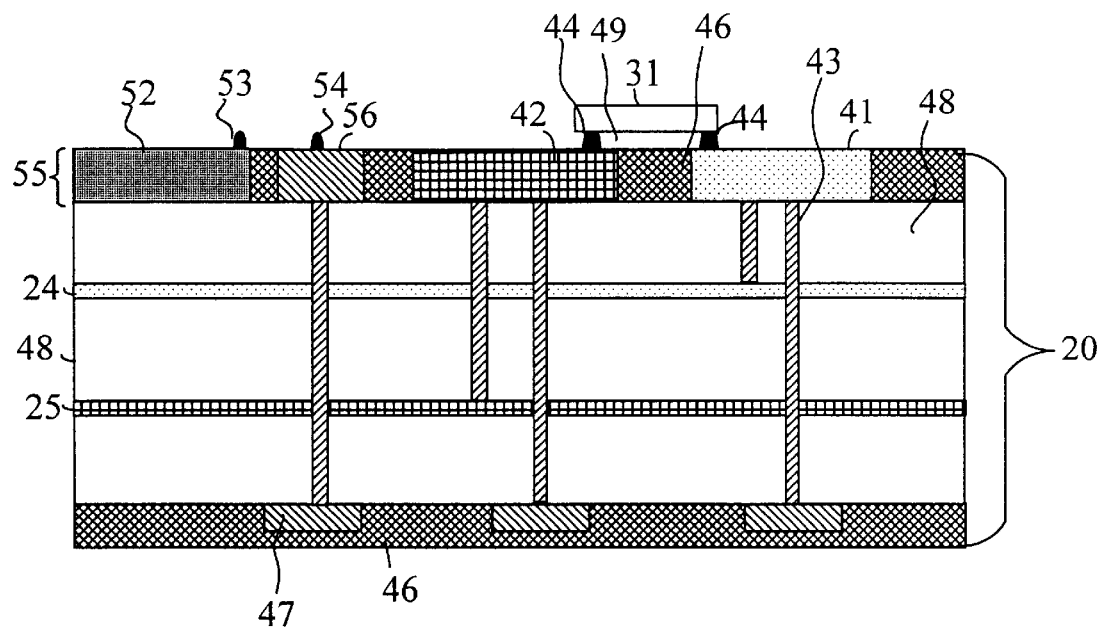
Figure 5C:
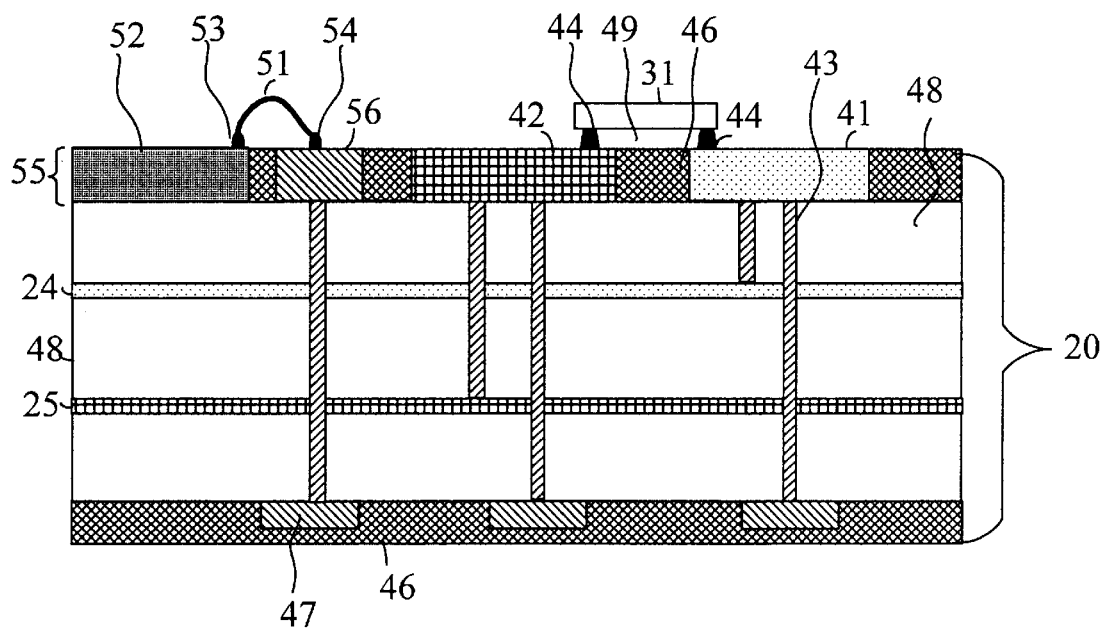

FIGS. 5(a) to 5(c) are cross-sectional views of structures made by the manufacturing method according to a second preferred embodiment of the present invention, and this embodiment places the capacitors 31 on the top side of the substrate 20. In FIG. 5(a), solder paste 44 is coated on a plurality of power pads 42 and ground pads 41 after input materials are inspected. In FIG. 5(b), adhesive glue 49 is coated beneath a plurality of capacitors 31, and the capacitors 31 are fixed on the power pads 42 and ground pads 41 by the adhesive glue 49 and solder paste 44. In FIG. 5(c), all the adhering steps are performed in a reflow-soldering stove. After that, the adhesive glue 49 is solidified, and impurities on the top side of the substrate 20 are cleaned and baked. For example, the impurities are cleaned by an ultrasonic cleaner. Then, other steps of packaging are processed, such as wire bonding between I/O ports 53 of the die 52 and wire-bonding points 54 on the wire-bonding region 56.

The above-described embodiments of the present invention are intended to be illustrated only. Numerous alternative embodiments may be devised by those skilled in the art without departing from the scope of the following claims.

What is claimed is:

1. A method for reducing an electrical noise inside a ball grid array package, used to install capacitors between a plurality of power pads and ground pads on a top side of a substrate of said ball grid array package to reduce the electrical noise, said method comprising the following steps:

(a) coating solder paste on the plurality of power pads and ground pads;

(b) coating adhesive glue beneath the plurality of capacitors;

(c) fixing the plurality of capacitors on the power pads and ground pads by said adhesive glue and solder paste; and (d) solidifying the adhesive glue in a reflow soldering stove.

2. The method of claim 1, after step (d) further comprising the step (e) of cleaning impurities on the top side of the substrate and then baking said ball grid array package.

3. The method of claim 2, wherein in step (e), the impurities are cleaned by an ultrasonic cleaner.

4. The method of claim 1, wherein said solder paste contains 63% tin and 37% lead.

5. A method for reducing an electrical noise inside a ball grid array package, used to install capacitors between a plurality of power pads and ground pads on a bottom side of a substrate of said ball grid array package to reduce the electrical noise, said method comprising the following steps:

(a) coating solder paste on the plurality of power pads and ground pads;

(b) coating adhesive glue beneath the plurality of capacitors;

(c) fixing the plurality of capacitors on the power pads and ground pads by said adhesive glue and solder paste;

(d) placing a plurality of soldering balls on the pads; and (e) solidifying the adhesive glue in a reflow soldering stove.

6. The method of claim 5, after step (e) further comprising the step (f) of cleaning impurities on the bottom side of the substrate and then baking said ball grid array package.

7. The method of claim 5, wherein said solder paste contains 63% tin and 37% lead.

8. The method of claim 6, wherein in step (f), the impurities are cleaned by a DI water.

9. A method for reducing an electrical noise inside a ball grid array package, used to install capacitors between a plurality of power pads and ground pads on top and bottom sides of a substrate of said ball grid array package to reduce the electrical noise, said method comprising the following steps:

(a) coating solder paste on the plurality of power pads and ground pads on said top and bottom sides of said substrate;

(b) coating adhesive glue beneath the plurality of capacitors;

(c) fixing the plurality of capacitors on the power pads and ground pads of said top and bottom sides of said substrate by said adhesive glue and solder paste;
(d) placing a plurality of soldering balls on the bottom side of the substrate; and
(e) solidifying the adhesive glue in a reflow soldering stove.

10. The method of claim 9, after step (e) further comprising the step (f) of cleaning impurities on the substrate and baking said ball grid array package.

11. The method of claim 9, wherein said solder paste contains 63% tin and 37% lead.

* * * * *